(12) United States Patent
Minakata et al.

(10) Patent No.: US 12,083,784 B2
(45) Date of Patent: Sep. 10, 2024

(54) TEMPORARY BONDING BODY OF CERAMIC RESIN COMPOSITE AND METAL PLATE, METHOD FOR PRODUCING SAME, OBJECT TO BE TRANSPORTED INCLUDING THE TEMPORARY BONDING BODY, AND METHOD FOR TRANSPORTING SAME

(71) Applicant: DENKA COMPANY LIMITED, Tokyo (JP)

(72) Inventors: Yoshitaka Minakata, Omuta (JP); Toshitaka Yamagata, Omuta (JP); Saori Inoue, Omuta (JP); Ryo Yoshimatu, Omuta (JP); Ryuji Koga, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 1015 days.

(21) Appl. No.: 16/970,822

(22) PCT Filed: Mar. 6, 2019

(86) PCT No.: PCT/JP2019/008969
§ 371 (c)(1),
(2) Date: Aug. 18, 2020

(87) PCT Pub. No.: WO2019/172345
PCT Pub. Date: Sep. 12, 2019

(65) Prior Publication Data
US 2020/0406586 A1 Dec. 31, 2020

(30) Foreign Application Priority Data
Mar. 7, 2018 (JP) .................. 2018-041238

(51) Int. Cl.
*B32B 9/04* (2006.01)
*B32B 9/00* (2006.01)
*B32B 37/10* (2006.01)

(52) U.S. Cl.
CPC .............. *B32B 9/041* (2013.01); *B32B 9/005* (2013.01); *B32B 37/10* (2013.01); *B32B 2260/046* (2013.01); *B32B 2264/107* (2013.01); *B32B 2307/306* (2013.01); *B32B 2307/542* (2013.01); *B32B 2315/02* (2013.01)

(58) Field of Classification Search
CPC ......... B32B 9/041; B32B 9/005; B32B 37/10; B32B 2260/046; B32B 2264/107; B32B 2307/306; B32B 2307/542; B32B 2315/02; B32B 15/095; B32B 18/00; B32B 7/12; C04B 2237/361; C04B 2237/407; C04B 35/515; C04B 35/63456; C04B 37/021; C04B 41/83; H01L 23/373; H05K 3/38

USPC .......................................... 428/457
See application file for complete search history.

(56) References Cited

U.S. PATENT DOCUMENTS

| | | | |
|---|---|---|---|
| 3,227,591 A | 1/1966 | Lambert et al. | |
| 7,019,956 B2 | 3/2006 | Fujii et al. | |
| 10,487,013 B2 * | 11/2019 | Nishi .................. | C04B 35/584 |
| 2016/0227644 A1 * | 8/2016 | Hirotsuru ............ | H05K 1/0271 |
| 2019/0092695 A1 | 3/2019 | Nishi et al. | |
| 2020/0031723 A1 | 1/2020 | Noue et al. | |

FOREIGN PATENT DOCUMENTS

| | | | | |
|---|---|---|---|---|
| CN | 105264035 A | | 1/2016 | |
| CN | 105415803 A | * | 3/2016 | ............. B32B 15/04 |
| EP | 3 035 778 A1 | | 6/2016 | |
| JP | 2009-49062 A | | 3/2009 | |
| JP | 2016-111171 A | | 6/2016 | |
| JP | 2016103611 A | * | 6/2016 | |
| JP | 2016-169325 A | | 9/2016 | |
| JP | 2017-028130 A | | 2/2017 | |
| KR | 10-2016-0042883 A | | 4/2016 | |
| WO | WO-2017101540 A1 | * | 6/2017 | ............. B32B 15/08 |
| WO | 2017/155110 A1 | | 9/2017 | |
| WO | 2018/181606 A1 | | 10/2018 | |

OTHER PUBLICATIONS

Machine translation of CN 105415803 A (Year: 2016).*
Machine translation of JP 2016-103611 A (Year: 2016).*
Machine translation of WO 2017/101540 A1 (Year: 2017).*
Sep. 8, 2020 International Preliminary Report on Patentability issued in International Patent Application No. PCT/JP2019/008969.
Sep. 1, 2022 Decision of Refusal issued in Chinese Patent Application No. 201980005786.7.
May 7, 2019 Search Report issued in International Patent Application No. PCT/JP2019/008969.
Mar. 17, 2021 Extended Search Report issued in European Patent Application No. 19763421.5.
Mar. 18, 2022 Office Action issued in Chinese Patent Application No. 201980005786.7.
Dec. 20, 2021 Office Action issued in European Patent Application No. 19763421.5.
Nov. 30, 2023 Office Action issued in Korean Patent Application No. 2020-7013587.

* cited by examiner

*Primary Examiner* — Callie E Shosho
*Assistant Examiner* — Steven A Rice
(74) *Attorney, Agent, or Firm* — Oliff PLC

(57) ABSTRACT

A ceramic-metal temporary bonding body to inhibit breakage and degradation of a ceramic resin composite having low strength includes: a ceramic resin composite in which a non-oxide ceramic sintered body is impregnated with a thermosetting resin composition having cyanate groups in such a manner that a degree of cure calculated by differential scanning calorimetry is 5.0% or more and 70% or less; and a metal plate temporarily bonded to at least one surface of the ceramic resin composite. A shear bond strength between the ceramic resin composite and the metal plate is 0.1 MPa or more and 1.0 MPa or less.

5 Claims, No Drawings

TEMPORARY BONDING BODY OF CERAMIC RESIN COMPOSITE AND METAL PLATE, METHOD FOR PRODUCING SAME, OBJECT TO BE TRANSPORTED INCLUDING THE TEMPORARY BONDING BODY, AND METHOD FOR TRANSPORTING SAME

TECHNICAL FIELD

The present invention relates to a temporary bonding body of a metal plate and a ceramic resin composite obtained using a thermosetting resin composition, and a method for producing the temporary bonding body. The present invention also relates to an object to be transported including the temporary bonding body, and a method for transporting the transported object.

BACKGROUND ART

In recent years, as an electronic equipment typified by mobile phones, LED lighting systems, in-vehicle power modules and the like has been enhanced in performance and reduced in size, mounting technology has been rapidly advanced at the levels of semiconductor device mounting, printed circuit board mounting and apparatus mounting. Thus, the heat generation density inside an electronic equipment increases year after year, and how efficiently heat generated at the time of use is dissipated, and the reliability of the electronic equipment are important issues. Thus, ceramic resin composite sheets for fixing electronic members are required to have high heat conductivity and reliability.

For the ceramic resin composite sheet, thermosetting resin compositions have been heretofore used which are prepared in the following manner: ceramic powder having high heat conductivity, such as aluminum oxide powder, silicon nitride powder, boron nitride powder or aluminum nitride powder, is dispersed in an uncured thermosetting resin, the resulting dispersion is then formed into a sheet by, for example, coating with various coaters, and the thermosetting resin is brought into a semi-cured state by heating.

Regarding a metal base circuit board, Patent Literature 1 suggests that a metal base circuit board excellent in heat dissipation property may be conveniently prepared in the following manner: a metal foil is disposed on a thermally conductive insulating adhesive sheet having ceramic powder dispersed in a semi-cured (i.e., "B-stage") thermosetting resin, and the thermosetting resin contained in the thermally conductive insulating adhesive sheet is cured into a C-stage.

However, in the invention of Patent Literature 1, a thermosetting resin layer having low thermal conductivity is present between the particles of the ceramic powder, and therefore there is a limit on achievement of high thermal conductivity with the thermal conductivity being at most 15 W/(m·K).

Patent Literature 2 suggests a ceramic resin composite processed into a plate shape, where the ceramic resin composite is prepared in the following manner: ceramic primary particles having high thermal conductivity are sintered to give a ceramic sintered body having a three-dimensionally continuous integrated structure, and the pores of the ceramic sintered body are filled with a thermosetting resin. This structure provides a ceramic resin composite having high thermal conductivity and adhesiveness.

CITATION LIST

Patent Literature

Patent Literature 1: Japanese Patent Laid-Open No. 2009-49062
Patent Literature 2: Japanese Patent Laid-Open No. 2016-111171

SUMMARY OF INVENTION

Technical Problem

However, in the invention of Patent Literature 2, as a method for bonding a ceramic resin composite sheet and a metal plate to each other, a method is employed in which a ceramic resin composite sheet is cured by heating, and a thermosetting resin being used is then applied to a surface of the ceramic resin composite sheet again, followed by performing pressurization and heating. In the conventional method, the resin is completely cured to exhibit high adhesive strength, but once bonding is performed, the thermosetting resin is completely irreversibly cured and denatured (degenerated), so that it is impossible to perform bonding again. That is, in the case where the metal plate is bonded to both surfaces of the ceramic resin composite sheet, it is necessary to collectively perform the bonding by heating one time.

The ceramic resin composite sheet with a metal plate bonded to both surfaces by heating and application of pressure as described above cannot be further processed. Thus, there is a problem that requests from customers who want to process the ceramic resin composite sheet cannot be met. On the other hand, however, transportation of only the ceramic resin composite sheet without bonding the metal plate thereto causes the problem that defects such as cracks easily occur during transportation because the sheet has low strength.

Solution to Problem

In view of the conventional techniques described above, an object of the present invention is to provide a temporary bonding body which can be safely and easily transported even when the temporary bonding body includes a ceramic resin composite having low strength and which can be reprocessed. The present inventors have found that when before transportation of a ceramic resin composite to a customer, a metal plate is bonded to one surface of the complex without degenerating a thermosetting resin, a metal plate can be bonded to the other surface after transportation, and impacts on the ceramic resin composite during transportation can be relaxed to prevent degradation. Thus, the present invention has been completed. That is, for solving the above-described problems, embodiments of the present invention can provide the following.

[1]
A ceramic-metal temporary bonding body, comprising:
a ceramic resin composite in which a non-oxide ceramic sintered body is impregnated with a thermosetting resin composition having cyanate groups in such a manner that a degree of cure calculated by differential scanning calorimetry is 5.0% or more and 70% or less; and
a metal plate temporarily bonded to at least one surface of the ceramic resin composite, wherein a shear bond strength between the ceramic resin composite and the metal plate is 0.1 MPa or more and 1.0 MPa or less.

[2]

The ceramic-metal temporary bonding body according to [1], wherein a metal plate is temporarily bonded to only one surface of the ceramic resin composite.

[3]

An object to be transported in which the ceramic-metal temporary bonding body described in [1] or [2] is wrapped with a packaging material.

[4]

A method for producing a ceramic-metal temporary bonding body, the method comprising the steps of:
  preparing a ceramic resin composite by impregnating a non-oxide ceramic sintered body with a thermosetting resin composition having cyanate groups in such a manner that a degree of cure calculated by differential scanning calorimetry is 5.0% or more and 70% or less;
  applying a liquid compound with active hydrogen to at least one surface of the ceramic resin composite or a metal plate having a ten-point average roughness of 20 μm or less; and
  bringing the ceramic resin composite and the metal plate in close contact with each other, and then applying a compressive load of 250 MPa or less at a temperature of 0° C. to 40° C. to temporarily bond the ceramic resin composite and the metal plate to each other in such a manner that a shear bond strength between the ceramic resin composite and the metal plate is 0.1 MPa or more and 1.0 MPa or less.

[5]

A method for transporting a ceramic-metal temporary bonding body, comprising the steps of:
  placing in a transportation box the object according to [3]; and
  transporting the transportation box.

[6]

The method according to [5], wherein the object is placed in the transportation box together with a cushioning material to substantially prevent the ceramic-metal temporary bonding body from moving in the transportation box.

Advantageous Effects of Invention

The ceramic-metal temporary bonding body provided by an embodiment of the present invention allows a ceramic resin composite portion to be processed even after transportation to a customer, and exhibits the effect of having high resistance to impacts during transportation, and high reliability.

DESCRIPTION OF EMBODIMENTS

Herein, the value range includes the upper limit and the lower limit of the range unless otherwise specified. Various materials used in embodiments of the present invention, evaluation methods and evaluation results will be described below.

Temporary Bonding Body

The ceramic-metal temporary bonding body according to embodiments of the present invention refers to a temporary bonding body in which a metal plate is temporarily bonded to at least one surface, preferably only one surface, of a "ceramic resin composite" or "ceramic resin composite sheet" as described later. Herein, the "temporary bonding" of the metal plate means that without heating a thermosetting resin permeating a ceramic resin composite to be temporarily bonded, i.e. without degeneration of the thermosetting resin, the metal plate is bonded to the ceramic resin composite. The "heating" mentioned in relation to the definition of the "temporary bonding" means that under an environment in which the ceramic resin composite and the metal plate to be temporarily bonded are placed, heat is applied to the targets to the extent that the temperature is higher than the ambient temperature. The ambient temperature is typically 0 to 40° C. or ordinary temperature. The "heating" includes applying heat to the extent that the temperature is, for example, 40° C. or higher than ordinary temperature, and one example thereof is application of heat at about 200° C. with a heater or the like, which does not include slight temperature elevation caused by pressing. That is, the "temporary bonding body" herein refers to a bonded body which is not a final product and which has not been substantially subjected to the "heating", and allows a ceramic resin composite portion to be processed. The "degeneration" mentioned in relation to the definition of the "temporary bonding" means that the thermosetting resin is denatured by heat, and curing reaction proceeds, so that the degree of cure substantially increases. Before and after temporary bonding herein, the degree of cure does not substantially increase except for measurement errors, and therefore it can be considered that the thermosetting resin is not degenerated. From a practical viewpoint, the shear bond strength between the ceramic resin composite and the metal plate in the temporary bonding is preferably such that detachment does not occur even when the temporary bonding body is moved or reoriented. In preferred embodiments, the shear bond strength may be 0.1 MPa or more, more preferably 0.2 MPa or more, still more preferably 0.3 MPa or more. A shear bond strength of less than 0.1 MPa is not preferable because the metal plate and the ceramic resin composite may be easily detached from each other. The upper limit of the shear bond strength is 1.0 MPa, and the shear bond strength is unlikely to exceed the upper limit as long as bonding is performed in such a manner that the thermosetting resin permeating the ceramic resin composite is not degenerated by heating. In an embodiment, a temporarily bonded portion may be peeled off by a mechanical means or the like. In another embodiment, a temporarily bonded portion may be unpeeled until a final product is obtained. Herein, bonding intended to obtain a final product and involving heating and pressurization may be referred to "permanent bonding", and distinguished from the "temporary bonding". In general, the shear bond strength between the ceramic resin composite and the metal plate in permanent bonding performed by heating and pressurization may be more than at least about 2 MPa, and can be clearly distinguished from the shear bond strength in the "temporary bonding".

Non-Oxide Ceramic Sintered Body, Ceramic Resin Composite, Ceramic Resin Composite Sheet and Insulating Layer Herein, the state in which two or more non-oxide ceramic primary particles are aggregated in a state of being bound together by sintering is defined as a "non-oxide ceramic sintered body" having a three-dimensionally continuous integrated structure. Herein, the complex composed of a non-oxide ceramic sintered body and a thermosetting resin composition is furthermore defined as a "ceramic resin composite". The ceramic resin composite processed into a plate shape is defined as a "ceramic resin composite sheet". The "ceramic resin composite" or the "ceramic resin composite sheet" have at least two surfaces to which the metal plate may be bonded.

The binding of non-oxide ceramic primary particles may be evaluated by observing the binding portions of non-oxide ceramic primary particles on the cross-sections of the primary particles with the aid of a scanning electron microscope (for example "JSM-6010LA" manufactured by JEOL Ltd.). As pretreatment for observation, non-oxide ceramic particles is embedded in a resin, then processed by a CP (cross-section polisher) method, and fixed on a sample stage, followed by performing osmium coating. The magnification in observation may be set to, for example, 1500 times. A non-oxide ceramic sintered body for evaluation may be prepared by incinerating a thermosetting resin composition of a ceramic resin composite in an air atmosphere at 500 to 900° C. In the case where non-oxide ceramic primary particles are not bound together by sintering, the shape cannot be maintained in incineration.

Average Long Diameter

The average long diameter of non-oxide ceramic primary particles in the non-oxide ceramic sintered body is preferably in the range of 3.0 µm to 60 µm. When the average long diameter is less than 3.0 µm, thermal conductivity and tensile shear bond strength may be reduced because the elastic modulus of the non-oxide ceramic sintered body increases, so that it is difficult for the ceramic sintered body to follow the irregularities of the adherend surface at the time of bonding an adherend such as a metal plate or a metal circuit to the ceramic resin composite sheet by heating and pressurization. When the average long diameter is more than 60 µm, the strength of the ceramic resin composite may be reduced, resulting in reduction of bonding strength with the adherend.

Definition and Evaluation of Average Long Diameter

The average long diameter of non-oxide ceramic primary particles may be determined as follows. As pretreatment for observation of the particles, a non-oxide ceramic sintered body is embedded in a resin, then processed by a CP (cross-section polisher) method, and fixed on a sample stage, followed by performing osmium coating. Thereafter, a SEM image is formed with the aid of a scanning electron microscope, for example "JSM-6010LA" (manufactured by JEOL Ltd.), the resulting cross-section particle image is captured in image analysis software, for example "AZOKUN" (manufactured by Asahi Kasei Engineering Corporation), and measurement is performed. Here, the magnification of the image may be set to, for example, 100 times, and the number of pixels in image analysis may be set to 15,100,000. The long diameters of randomly selected 100 of the obtained particles are determined by manual measurement, and the average thereof is defined as an average long diameter.

Aspect Ratio

The aspect ratio of the non-oxide ceramic primary particle is preferably in the range of 5.0 to 30. When the aspect ratio is less than 5.0, thermal conductivity and tensile shear bond strength may be reduced because the elastic modulus of the non-oxide ceramic sintered body increases, so that it is difficult for the ceramic sintered body to follow the irregularities of an adherend surface at the time when an adherend which is a metal plate (that may include a metal circuit, etc.) is bonded to the ceramic resin composite sheet by heating and pressurization. In contrast, when the aspect ratio is more than 30, the strength of the ceramic resin composite may be reduced, resulting in reduction of bonding strength with an adherend.

Method for Evaluating Aspect Ratio

The aspect ratio may be determined as follows. As pretreatment for observation, a non-oxide ceramic sintered body is embedded in a resin, then processed by a CP (cross-section polisher) method, and fixed on a sample stage, followed by performing osmium coating. Thereafter, a SEM image is formed with the aid of a scanning electron microscope, for example "JSM-6010LA" (manufactured by JEOL Ltd.), the resulting cross-section particle image is captured in image analysis software, for example "AZOKUN" (manufactured by Asahi Kasei Engineering Corporation), and measurement may be performed. Here, the magnification of the image may be set to 100 times, and the number of pixels in image analysis may be set to 15,100,000. By manual measurement, randomly selected 100 of the obtained particles are observed, and the long diameters and the short diameters of the particles are measured. The values of the aspect ratios of the particles are calculated from the calculation formula: aspect ratio=long diameter/short diameter. The average thereof is defined as an aspect ratio.

Ratio of Non-Oxide Ceramic Sintered Body

The amount of the non-oxide ceramic sintered body in the ceramic resin composite is preferably within the range of 35 vol % to 70 vol % (i.e., the amount of the thermosetting resin composition is 30 to 65 vol %). When the amount of the non-oxide ceramic sintered body is less than 35 vol %, the ratio of thermosetting resin compositions having low thermal conductivity increases, resulting in reduction of thermal conductivity. When the amount of the non-oxide ceramic sintered body is more than 70 vol %, tensile shear bond strength and thermal conductivity may be reduced because it is difficult for the thermosetting resin composition to infiltrate the irregularities of an adherend surface at the time when an adherend which is a metal plate (that may include a metal circuit, etc.) is permanently bonded to the ceramic resin composite sheet by heating and pressurization. The ratio in vol % of the non-oxide ceramic sintered body in the ceramic resin composite may be determined by measuring the bulk density and the porosity of the non-oxide ceramic sintered body as described below.

$$\text{Bulk density } (D) \text{ of non-oxide ceramic sintered body=mass/volume} \quad (1)$$

$$\text{Porosity of non-oxide ceramic sintered body}=(1-(D/(\text{true density of non-oxide ceramic})))\times 100=\text{ratio of thermosetting resin} \quad (2)$$

$$\text{Ratio of non-oxide ceramic sintered body}=100-\text{ratio of thermosetting resin} \quad (3)$$

The pores of a typical ceramic sintered body include closed pores and open pores, and in the case of the non-oxide ceramic sintered body, control of the average long diameter, the aspect ratio and the like of non-oxide ceramic particles ensures that presence of closed pores is negligible (1% or less). Further, the average pore size is not particularly limited, and is normally 0.1 to 3.0 μm from the viewpoint of the thermosetting resin impregnating ability.

Main Component of Non-Oxide Ceramic Sintered Body

The ceramic resin composite including a non-oxide ceramic sintered body may be used for power modules, etc. which are required to have high reliability. Thus, the main component of a non-oxide ceramic sintered body is preferably boron nitride. In further preferred embodiments, the thermal conductivity of the boron nitride may be set to 40 W/(m·K) or more. When it is intended to obtain a sheet-shaped final product, the shape of the non-oxide ceramic sintered body is a flat plate shape.

Method for Producing Non-Oxide Ceramic Sintered Body

The non-oxide ceramic sintered body may be produced by, for example, blending boron nitride powder with a sintering aid such as calcium carbonate, sodium carbonate or boric acid in a ratio of about 0.01 to 20 wt %, molding the resulting mixture with a mold or by a known method such as cold isostatic pressing (CIP), and sintering the molded product at a temperature of 1500 to 2200° C. for about 1 to 30 hours in a non-oxidizing atmosphere such as nitrogen or argon. Such a production method is known, and commercialized products are available. Also when aluminum nitride or silicon nitride powder is used, the non-oxide ceramic sintered body may be produced by a similar method with the aid of a sintering aid such as yttria, alumina, magnesium or a rare earth element oxide. Examples of sintering furnaces include batch-type furnaces such as muffle furnaces, tubular furnaces and atmosphere furnaces, and continuous furnaces such as rotary kilns, screw conveyor furnaces, tunnel furnaces, belt furnaces, pusher furnaces and vertical continuous furnaces. Which of the furnaces is used depends on a purpose. For example, a batch-type furnace is employed when a small amount of each of many types of non-oxide ceramic sintered bodies is produced, and a continuous furnace is employed when a large amount of a certain type of non-oxide ceramic sintered body is produced.

Combination of Non-Oxide Ceramic Sintered Body with Thermosetting Resin Composition The non-oxide ceramic sintered body may be combined with the thermosetting resin composition by, for example, impregnating the non-oxide ceramic sintered body with the thermosetting resin composition. The impregnation of the thermosetting resin composition may be performed by vacuum impregnation, pressure impregnation at 1 to 300 MPa, or a combination thereof. The pressure in vacuum impregnation is preferably 1000 Pa or less, more preferably 100 Pa or less. In the case where pressure impregnation is performed, it may be impossible to sufficiently impregnate the inside of the non-oxide ceramic sintered body with the thermosetting resin composition when the pressure is less than 1 MPa, and the scale of an equipment increases to deteriorate cost efficiency when the pressure is more than 300 MPa. For easily impregnating the inside of the non-oxide ceramic sintered body with the thermosetting resin composition, it is more preferable to reduce the viscosity of the thermosetting resin composition by heating the composition to 100 to 180° C. in vacuum impregnation or pressure impregnation.

Semi-Curing of Thermosetting Resin Composition

The thermosetting resin composition combined with the non-oxide ceramic sintered body may be semi-cured (brought into a B-stage) to obtain a ceramic resin composite. The heating method may be infrared heating, hot air circulation, an oil heating method, a hot plate heating method or a combination thereof. Semi-curing may be directly performed by utilizing the heating function of an impregnation apparatus after completion of impregnation, or may be separately performed by using a known apparatus such as a hot air circulation conveyor furnace or the like after the ceramic resin composite is taken out from the impregnation apparatus. In embodiments of the present invention, the degree of cure of the thus-cured thermosetting resin composition falls within the range of 5.0% or more and 70% or less as calculated by differential scanning calorimetry as described later.

Exothermic Onset Temperature of Thermosetting Resin Composition

It is preferable that the thermosetting resin composition contained in the ceramic resin composite have an exothermic onset temperature of 180° C. or more as measured with a differential scanning calorimeter. When the exothermic onset temperature is less than 180° C., heating of the thermosetting resin composition in vacuum impregnation and pressure impregnation causes curing reaction of the thermosetting resin composition to proceed, and thus the viscosity of the thermosetting resin composition increases, so that voids are generated in the ceramic resin composite, leading to reduction of the dielectric breakdown voltage. The upper limit of the exothermic onset temperature is not particularly limited, and is normally 300° C. or less in view of productivity and heat resistance of apparatus components at the time when an adherend which is the metal plate (that may include a metal circuit, etc.) is permanently bonded to the ceramic resin composite sheet by heating and pressurization. The exothermic onset temperature may be controlled with a curing promotor.

Method for Evaluating Exothermic Onset Temperature of Thermosetting Resin Composition The exothermic onset temperature is a temperature determined from an intersection of a base line and an extrapolation line drawn from a curve initial rise in an exothermic curve obtained when the thermosetting resin composition is cured by heating with a differential scanning calorimeter.

Type of Thermosetting Resin Composition

For the thermosetting resin composition, a substance having a cyanate group is required. Examples of the substance having a cyanate group include 2,2'-bis(4-cyanatophenyl)propane, bis(4-cyanato-3,5-dimethylphenyl)methane, 2,2'-bis(4-cyanatophenyl)hexafluoropropane, 1,1'-bis(4-cyanatophenyl)ethane, and 1,3-bis(2-(4cyanatophenyl)isopropyl)benzene. The reason for use of a substance having a cyanate group is that reaction of a cyanate group with a liquid compound having active hydrogen provides weak bonding to enable temporary bonding.

The substance having a cyanate group can be used singly, and it is preferable to optionally mix a resin having an epoxy group, a hydroxyl group or a maleimide group. Examples of the substance having an epoxy group may include bisphenol A-type epoxy resins, bisphenol F-type epoxy resins, polyfunctional epoxy resins (cresol novolac epoxy resins, dicyclopentadiene-type epoxy resins and the like), cycloaliphatic epoxy resins, glycidyl ester-type epoxy resins and glycidyl amine-type epoxy resins, examples of the substance having a hydroxyl group include phenol novolac resins and 4,4'-(dimethylmethylene)bis[2-(2-propenyl)phenol].

Examples of the substance having a maleimide group may include 4,4'-diphenylmethane bismaleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 4,4'-diphenyl ether bismaleimide, 4,4'-diphenylsulfone bismaleimide, 1,3-bis(3-maleimidephenoxy)benzene, 1,3-bis(4-maleimidephenoxxy)benzene, bis-(3-ethyl-5-methyl-4-maleimidephenyl)methane, and 2,2-bis[4-(4-maleimidephenoxy)phenyl]propane.

Method for Improving Adhesion of Thermosetting Resin Composition

The thermosetting resin composition may optionally contain a silane coupling agent for improving adhesion between the non-oxide ceramic sintered body and the thermosetting resin composition, a defoaming agent for reducing generation of defects during impregnation and curing by promoting improvement of wettability and leveling property and reduction of viscosity, a surface conditioner and a wet dispersant. It is more preferable that the resin contain powder of one or more ceramics selected from the group consisting of aluminum oxide, silicon oxide, zinc oxide, silicon nitride, aluminum nitride, boron nitride, and aluminum hydroxide.

Degree of Cure of Thermosetting Resin Composition

It is necessary that the thermosetting resin composition have a degree of cure of 5.0% or more and 70% or less after the non-oxide ceramic sintered body is impregnated with the thermosetting resin composition. When the degree of cure is less than 5.0%, heat generated at the time of cutting the ceramic resin composite to a plate-shaped ceramic resin composite sheet melts an uncured thermosetting resin, resulting in occurrence of variation in thickness. The ceramic resin composite cannot endure impacts in the cutting, and thus cracking occurs, leading to reduction of the dielectric breakdown voltage of a circuit board. Further, an adhesive (resin) layer having low thermal conductivity is formed on the irregularities of an adherend surface, leading to reduction of thermal conductivity. When the degree of cure is more than 70%, the amount of the thermosetting resin composition seeping at the time of bonding by application of heat decreases, so that at the time of bonding the ceramic resin composite to the metal plate, gaps are easily generated at the interface between the complex and the metal plate, leading to reduction of adhesive strength. This effect may cause a decrease in dielectric strength voltage.

Method for Evaluating Degree of Cure of Thermosetting Resin Composition

The degree of cure of the thermosetting resin composition may be calculated from the following expression. As a differential scanning calorimeter, for example, DSC6200R (manufactured by Seiko Instruments Inc.) may be used. The thermosetting resin composition is completely cured in the following manner: 5 mg of a sample is heated at a temperature elevation rate of 10° C./min from room temperature to 300° C. under current of nitrogen gas with 5 mg of α-alumina as a reference.

$$\text{Degree of cure } [\%] = (X-Y)/X \times 100$$

X: total amount of heat [J/g] generated when the thermosetting resin composition before curing is carried out by heating is completely cured with the differential scanning calorimeter.

Y: total amount of heat [J/g] generated when the thermosetting resin composition brought into a semi-cured state (B stage) by heating is completely cured with the differential scanning calorimeter.

The "cured" state in X and Y may be determined from the peak of the exothermic curve obtained. Y may be calculated from the following expression even when the ceramic resin composite is used instead of the thermosetting resin composition.

$$Y = Y' \times 100/Z$$

Y': total amount of heat [J/g] generated when the resin composition in the ceramic resin composite is completely cured with the differential scanning calorimeter in the case where the ceramic resin composite is used.

Z: volume ratio [vol %] of the thermosetting resin composition contained in the ceramic resin composite.

Method for Evaluating Melt Temperature of Thermosetting Resin Composition

The melt temperature of the thermosetting resin composition contained in the ceramic resin composite in the present invention is preferably 70° C. or more. When the melt temperature is less than 70° C., heat generated at the time of cutting the ceramic resin composite to a plate-shaped ceramic resin composite sheet may melt a thermosetting resin, resulting in occurrence of variation in thickness. The upper limit of the melt temperature is not particularly limited, and the melt temperature is normally 180° C. or less when considering that it is necessary to suppress an increase in viscosity due to procession of curing reaction of the thermosetting resin composition at the time of bonding an adherend such as a metal plate or a metal circuit to the ceramic resin composite sheet by heating and pressurization. The melt temperature herein is a temperature at an endothermic peak at the time of heating the thermosetting resin composition through differential scanning calorimetry.

Thickness of Ceramic Resin Composite

The thickness of the ceramic resin composite (ceramic resin composite sheet) is typically 0.32 mm, and may be changed according to requirements. For example, when insulation properties at high voltage are not so important and thermal resistance is important, a thin board having a thickness of 0.1 to 0.25 mm may be used. In contrast, when insulation properties at high voltage and partial discharge characteristics are important, a thick board having a thickness of 0.35 to 1.0 mm is used. Thus, a thin ceramic resin composite is vulnerable to impacts, particularly impacts during transportation, and embodiments of the present invention enable improvement of impact resistance reliability.

Metal Plate

Herein, the concept of the "metal plate" includes not only mere metallic solid plate but also metal circuits, etc., which may be adherends. As a material for the metal plate, any metal may be used as long as it can be temporarily bonded to a thermosetting resin composition having a cyanate group at a temperature of 0° C. to 40° C. or ordinary temperature and in the presence of a liquid compound having active hydrogen. In preferred embodiments, copper or aluminum may be used from the viewpoint of thermal conductivity and costs. Silver, gold and the like are usable when considering only characteristics, but these metals are disadvantageous in terms of costs. The plate thickness of the metal plate is preferably 0.070 to 5.0 mm. A plate thickness of less than 0.070 mm is not preferable because the strength as a circuit board is reduced, so that cracking, chipping, warpage or the like easily occurs in the process of mounting electronic components. A plate thickness of more than 5.0 mm is not preferable because the thermal resistance of the metal plate itself increases, so that the heat dissipation property of the circuit board is deteriorated.

Temporarily Bonded Surface of Metal Plate

It is desirable that the temporarily bonded surface of the metal plate be subjected to surface treatment such as degreasing treatment, sandblasting, etching, various plating treatments, or primer treatment with a silane coupling agent for improving adhesion between the ceramic resin composite (also referred to an insulating layer) and the metal plate. The surface roughness of the temporarily bonded surface of the metal plate is preferably 20 μm or less, more preferably 0.1 μm to 20 μm in terms of ten-point average roughness ($R_{z\_jis}$). When the surface roughness is less than 0.1 μm, it may be difficult to secure sufficient adhesion with the ceramic resin composite sheet. When the surface roughness is more than 20 μm defects are easily generated at the bonding interface, which may cause reduction of voltage resistance and adhesion.

Method for Temporarily Bonding Metal Plate

In embodiments of the present invention, the metal plate may be temporarily bonded to the ceramic resin composite at a temperature of 0° C. to 40° C., preferably at ordinary temperature substantially without heating. Herein, the "ordinary temperature" refers to the temperature range specified in JIS Z8703:1983, specifically the temperature range of 5 to 35° C. It is necessary that the temporary bonding be performed in the following manner: a compound which is liquid at a temperature in the above-described temperature range and which has active hydrogen (hereinafter, referred to simply as a "liquid compound") is applied to one surface of at least one of the ceramic resin composite and the metal plate, and both the coated surfaces, or the coated surface and a surface to which the compound has not been applied are then brought into close contact with each other, followed by evaporating the liquid compound while applying pressure. That is, after the temporary bonding, the liquid compound does not substantially remain at the bonding interface. In this method, the liquid compound and the cyanate have weak bonding to contribute to temporary bonding. A temporary bonding temperature of less than 0° C. is not preferable because a part of the liquid compound becomes cooled below the melting temperature, is thus solidified, and does not contribute to temporary bonding. A temporary bonding temperature of more than 40° C. is not preferable because a part of the liquid compound is immediately volatilized, so that weak bonding is no longer obtained. The temporary bonding pressure may be preferably 0.1 MPa or more and 250 MPa or less, more preferably 30 MPa or less. When the pressure is excessively high, e.g. more than 250 MPa, the ceramic sintered body may be broken at the time of pressing. When the pressure is excessively low, e.g. 0.1 MPa or less, the liquid compound does not penetrate to the bonding interface, thus causing no bonding. The time taken for temporary bonding is preferably equal to time for the liquid compound to be evaporated. For example, the time is preferably 10 minutes or more.

Type of Liquid Compound Having Active Hydrogen

The liquid compound having active hydrogen may be selected from a wide range of types of compounds, and these compounds have a hydroxyl group, an amino group or a carboxyl group in the molecule. Examples thereof include alcohols, amines and carboxylic acids, and this category of compounds also include silane-based coupling agents and titanate-based coupling agents having any of the above-mentioned functional groups. In preferred embodiments, an alcohol having 1 to 10 carbon atoms, such as methanol, ethanol or phenol may be used as the liquid compound, with methanol or ethanol being more preferable. The liquid compound is preferably volatile at a temperature of 0° C. to 40° C. or ordinary temperature from the viewpoint of performing temporary bonding.

EXAMPLES

The present invention will be described in further detail below by way of Examples and Comparative Examples.

Success or Failure of Temporary Bonding:
Examples 1 to 10 and Comparative Examples 1 to 5

Preparation of Ceramic Resin Composite Sheet

A ceramic sintered body was impregnated with a thermosetting resin on the basis of a combination as shown in Table 1. From the resulting ceramic resin composite, a ceramic resin composite sheet was prepared by using a multi-cutting wire saw ("SW1215" manufactured by Yasunaga Corporation). As the resins shown in Table 1, a bismaleimide-triazine resin ("BT2160" manufactured by Mitsubishi Gas Chemical Company, Inc.) was used for cyanate A, a novolac-type cyanate resin ("PT-30" manufactured by Lonza) was used for cyanate B, a bisphenol A-type cyanate resin ("CYTESTERTA" manufactured by Mitsubishi Gas Chemical Company, Inc.) was used for cyanate C, a novolac-type cyanate resin and a difunctional naphthalene-type epoxy resin ("HP-4032D" manufactured by DIC Corporation) were used for cyanate D, and a novolac-type cyanate resin and 4,4'-diphenylmethane-type bismaleimide resin ("BMI" manufactured by K.I Chemical Industry Co., Ltd.) were for cyanate E. A difunctional naphthalene-type epoxy resin ("HP-4032D" manufactured by DIC Corporation) and KR311 (manufactured by Shin-Etsu Chemical Co., Ltd.) were used, respectively, for epoxy and silicone shown in Table 1. The ceramic sintered body was prepared by pressing a ceramic material with a CIP (cold isostatic pressing) apparatus ("ADW800" manufactured by Kobe Steel, Ltd.), and then sintering the material in a batch-type high-frequency furnace ("FTH-300-1H" manufactured by Fujidempa Kogyo Co., Ltd.). For impregnation of the thermosetting resin, a vacuum heating impregnation apparatus ("G-555AT-R" manufactured by Kyosin Engineering Corporation) and a pressure heating impregnation apparatus ("HP-4030AA-H45" manufactured by Kyosin Engineering Corporation) were used. After preparation of the ceramic resin composite, heating was additionally performed to set the degree of cure of the thermosetting resin to a value as shown in Table 1. The degree of cure of the thermosetting resin composition was determined with a differential scanning calorimeter, "DSC6200R" manufactured by Seiko Instruments Inc.

Preparation of Temporary Bonding Body

A temporary bonding body was prepared at room temperature (ordinary temperature) with a press machine (apparatus name: MHPC-VF-350-350-1-45, manufactured by MEIKI CO., LTD.), where a copper plate having a ten-point average roughness of 10 μm was used as a metal plate, and a pressure and a solvent as shown in Table 1 were employed. The ambient environment had atmospheric pressure. The pressurization time required for temporary bonding was 10 min (minutes). The liquid compound used as a solvent and having active hydrogen was applied to a surface of the ceramic resin composite at ordinary temperature to the extent that a liquid pool was not formed. Even a large amount of the solvent does not cause a problem because all the solvent, except for a portion infiltrating the interface, escapes outside the bonded surfaces.

Determination of Success or Failure of Preparation of Temporary Bonding Body

For determination of success or failure of preparation of a temporary bonding body, the tensile shear bond strength was measured in conformity to JIS K6850:1999. Specifically, in a Tensilon tester (manufactured by Toyo Baldwin Co., Ltd.), the metal plate of the temporary bonding body was gripped, and measurement was performed at a tension speed of 50 mm/sec. Samples shown to exhibit a tensile shear bond strength of 0.1 MPa or more were evaluated as being successfully temporarily bonded. This is because when the tensile shear bond strength is less than 0.1 MPa, a phenomenon occurs in which turning of the sample causes peeling and falling of the ceramic resin composite, it is impossible to measure the tensile shear bond strength because the sample is peeled off at the time of performing the measurement, or the ceramic resin composition is peeled off in transportation. The process of combining the interfaces of the ceramic resin composite and the metal plate for removal of air before performing bonding (permanent bonding) according to the conventional art does not fall under the above-described temporary bonding because the shear bond strength at the interface is typically less than 0.1 MPa. Realistically, the shear bond strength at the interface in temporary bonding does not exceed the shear bond strength at the interface in permanent bonding by pressurization and heating.

Example 1

In example 1, cyanate A was used for the thermosetting resin, the degree of cure of the resin was 15%, ethanol was used as a solvent, a copper plate was used as a metal plate, and the applied pressure was 2 MPa. The tensile shear bond strength of a temporary bonding body obtained was 0.30 MPa.

Example 2

Example 2 is different from Example 1 in that the applied pressure was 0.1 MPa. The tensile shear bond strength of a temporary bonding body obtained was 0.27 MPa.

Example 3

Example 3 is different from Example 1 in that the applied pressure was 250 MPa. The tensile shear bond strength of a temporary bonding body obtained was 0.32 MPa.

Example 4

Example 4 is different from Example 1 in that methanol was used as a solvent. The tensile shear bond strength of a temporary bonding body obtained was 0.30 MPa.

Example 5

Example 5 is different from Example 1 in that methanol was used as a solvent, and the applied pressure was 20 MPa. The tensile shear bond strength of a temporary bonding body obtained was 0.29 MPa.

Example 6

Example 6 is different from Example 1 in that the degree of cure of the thermosetting resin was 50%. The tensile shear bond strength of a temporary bonding body obtained was 0.31 MPa.

Example 7

Example 7 is different from Example 1 in that cyanate B was used for the thermosetting resin, and the resin degree of cure was 40%. The tensile shear bond strength of a temporary bonding body obtained was 0.32 MPa.

Example 8

Example 8 is different from Example 1 in that cyanate C was used for the thermosetting resin, and the resin degree of cure was 45%. The tensile shear bond strength of a temporary bonding body obtained was 0.33 MPa.

Example 9

Example 9 is different from Example 1 in that cyanate D was used for the thermosetting resin, and the resin degree of cure was 35%. The tensile shear bond strength of a temporary bonding body obtained was 0.29 MPa.

Example 10

Example 10 is different from Example 1 in that cyanate E was used for the thermosetting resin, and the resin degree of cure was 40%. The tensile shear bond strength of a temporary bonding body obtained was 0.27 MPa.

Comparative Example 1

Comparative Example 1 is different from Example 1 in that the resin degree of cure was 25%, and acetone having no active hydrogen was used as a solvent. The shear bond strength was 0 MPa (not bonded).

Comparative Example 2

Comparative Example 2 is different from Example 1 in that the resin degree of cure was 80%. The shear bond strength was 0.02 MPa.

Comparative Example 3

Comparative Example 3 is different from Example 1 in that epoxy having no cyanate group was used for the thermosetting resin, and the resin degree of cure was 30%. The shear bond strength was 0 MPa (not bonded).

Comparative Example 4

Comparative Example 4 is different from Example 1 in that silicone having no cyanate group was used for the thermosetting resin, and the resin degree of cure was 20%. The shear bond strength was 0 MPa (not bonded).

Comparative Example 5

Comparative Example 5 is different from Example 1 in that a solvent was not used, and the resin degree of cure was 25%. The shear bond strength was 0 MPa (not bonded).

For all of Examples and Comparative Examples in which temporary bonding was performed without heating, the difference in degree of cure of the thermosetting resin before and after temporary bonding is only about 2% or less, and this difference is ascribable to a measurement error. Thus, it is confirmed that temporary bonding does not substantially degenerate the thermosetting resin. The above results show that for achieving temporary bonding, a thermosetting resin having a cyanate group be used so as to attain a degree of cure of 5.0% to 70%, and a liquid compound having active hydrogen be used as a solvent.

TABLE 1

| Examples | Ceramic | Thermo-setting resin | Degree of resin cure (%) | Solvent | Applied pressure (MPa) | Shear bond strength of temporary bonding body (MPa) |
|---|---|---|---|---|---|---|
| Example 1 | Boron nitride | Cyanate A | 15 | Ethanol | 2 | 0.30 |
| Example 2 | Boron nitride | Cyanate A | 15 | Ethanol | 0.1 | 0.27 |
| Example 3 | Boron nitride | Cyanate A | 15 | Ethanol | 250 | 0.32 |
| Example 4 | Boron nitride | Cyanate A | 15 | Methanol | 2 | 0.30 |
| Example 5 | Boron nitride | Cyanate A | 15 | Methanol | 20 | 0.29 |
| Example 6 | Boron nitride | Cyanate A | 50 | Ethanol | 2 | 0.31 |
| Example 7 | Boron nitride | Cyanate B | 40 | Ethanol | 2 | 0.32 |
| Example 8 | Boron nitride | Cyanate C | 45 | Ethanol | 2 | 0.33 |
| Example 9 | Boron nitride | Cyanate D | 35 | Ethanol | 2 | 0.29 |
| Example 10 | Boron nitride | Cyanate E | 40 | Ethanol | 2 | 0.27 |

TABLE 1-continued

| Examples | Ceramic | Thermo-setting resin | Degree of resin cure (%) | Solvent | Applied pressure (MPa) | Shear bond strength of temporary bonding body (MPa) |
|---|---|---|---|---|---|---|
| Comparative Example 1 | Boron nitride | Cyanate A | 25 | Acetone | 2 | 0 |
| Comparative Example 2 | Boron nitride | Cyanate A | 80 | Ethanol | 2 | 0.02 |
| Comparative Example 3 | Boron nitride | Epoxy | 30 | Ethanol | 2 | 0 |
| Comparative Example 4 | Boron nitride | Silicone | 20 | Ethanol | 2 | 0 |
| Comparative Example 5 | Boron nitride | Cyanate A | 25 | None | 2 | 0 |

Evaluation of Reliability for Transportation:
Examples A and B and Comparative Examples A and B Reliability for transportation was evaluated using a temporary bonding body prepared on the basis of Examples above, and a usual ceramic resin composite sheet. Transportation over 2500 km, which is categorized as the strictest transportation condition among test categories in JIS Z0232: 2004, was performed. For the ceramic resin composite sheet as a transportation sample, one prepared in Example 1 in Table 1 was used. The sheet was transported in the form of a temporary bonding body in Examples A and B, and in the form of a ceramic resin composite sheet alone in Comparative Examples A and B.

The first packaging method is a method in which a sample is completely wrapped with a first cushioning material (green sheet, mirror mat or the like) to form an object to be transported, and a second cushioning material (bubble cushioning material, rolled cardboard, resin chip or the like) is used so as to prevent movement of the transporting object in a transportation box (cardboard box or the like). The second packaging method is a method in which a sample is simply wrapped with a first cushioning material (green sheet, mirror mat or the like) to form an object, to be transported and the transporting object is placed in a transportation box as it is. That is, in the second packaging method, only the first cushioning material and the transportation box itself exhibit a cushioning action, so that as compared to the first packaging method, impacts from transportation are heavier, but transportation can be performed in a more convenient manner.

Transportation over 2500 km was performed with the configurations shown in Table 2 below, and after the transportation, permanent bonding was carried out by heating and pressurization, and the thermal resistance properties of permanently bonded bodies were measured and compared. To both surfaces of the ceramic resin composite sheet (Comparative Examples) or an exposed surface of the ceramic resin composite sheet of the temporary bonding body (Examples), a 1.0 mm-thick copper plate identical in external size to the sheet was bonded with a vacuum heating press machine ("MHPC-VF-350-350-1-45" manufactured by MEIKI CO., LTD.) under the conditions of a pressure of 5 MPa, a heating temperature of 240° C. and a heating time of 5 hours to prepare the permanent bonding body. A transient thermal resistance value was measured as a thermal resistance property of not a mere insulating material alone but a laminate including an insulating material, a heat dissipation plate and a cooler, the thermal resistance property including the interface thermal resistances of the laminate. Specifically, a time-dependent change (time history) until convergence of a chip temperature measured value to a substantially constant value during heating which gave a certain amount of heat to a heater chip was measured. As an apparatus for measuring the time-dependent change of the chip temperature measured value Ta, "T3Ster" manufactured by Mentor Graphics Corporation was employed.

Example A

In Example A, the object to be transported was configured to include a temporary bonding body, and the first packaging method was employed. The thermal resistance value of a permanent bonding body obtained by processing the temporary bonding body after transportation.

Example B

Example B is different from Example A in that the second packaging method was used. The relative thermal resistance of a permanent bonding body obtained was 110%. The thermal resistance value was slightly inferior to that in Example A, but was within the acceptable range.

Comparative Example A

Comparative Example A is different from Example A in that the state during transportation was set to a ceramic resin composite sheet alone. The relative thermal resistance of a permanent bonding body was 130% against that in Example A, and this shows that transportation in the state of a ceramic resin composite sheet alone caused deterioration.

Comparative Example B

Comparative Example B is different from Example A in that the state during transportation was set to a ceramic resin composite sheet alone, and the second packaging method was used. The relative thermal resistance of a permanent bonding body was 150% against that in Example A, and this marked increase in thermal resistance shows sharp deterioration.

TABLE 2

| | Sample used | Packaging method | Relative thermal resistance of permanent bonding body against that in Example A (%) after transportation |
|---|---|---|---|
| Example A | Ceramic-metal temporary bonding body obtained in Example 1 | First | — |
| Example B | Ceramic-metal temporary bonding body obtained in Example 1 | Second | 110 |
| Comparative Example A | Ceramic resin composite sheet alone obtained in Example 1 | First | 130 |
| Comparative Example B | Ceramic resin composite sheet alone obtained in Example 1 | Second | 150 |

Physical Properties of Adherend Subjected to Permanent Bonding after Temporary Bonding: Examples 1-1 to 3-1 and Comparative Examples 1-1 and 1-2

Effects of temporary bonding on the permanent bonding body were evaluated. Temporary bonding was performed under the temporary bonding conditions shown in Table 3 below, and thereafter, to an exposed surface of a ceramic resin composite sheet of a temporary bonding body having a width of 25 mm, a length of 12.5 mm and a thickness of 320 μm, a copper plate having a width of 25 mm, a length of 12.5 mm and a thickness of 1.0 mm was bonded with a vacuum heating press machine ("MHPC-VF-350-350-1-45" manufactured by MEIKI CO., LTD.) under the conditions of a pressure of 5 MPa, a heating temperature of 240° C. and a heating time of 5 hours to prepare a permanent bonding body. In Comparative Example, conditions for temporary bonding involved heating and pressurization for comparison.

Measurement of Thermal Conductivity of Permanent Bonding Body

As a measurement sample, a permanent bonding body was used, and measurement was performed in conformity to JIS H8453: 2010. As a measurement device, "TC-1200RH" manufactured by ADVANCE RIKO, Inc. was used.

Measurement of Tensile Shear Bond Strength of Permanent Bonding Body

The tensile shear bond strength of the permanent bonding body was measured in conformity to JIS K6850:1999. An autograph ("AG-100 kN" manufactured by Shimadzu Corporation) was used as a measurement apparatus, and measurement was performed under the measurement conditions of a measurement temperature of 25° C. and a crosshead speed of 5.0 mm/min.

Example 1-1

In Example 1-1, a temporary bonding body was prepared under the conditions of Example 1 in Table 1 (application of ethanol; at room temperature; pressing at 2 MPa/10 minutes), and a permanent bonding body was prepared by performing press bonding under the conditions of a pressure of 5 MPa, a heating temperature of 240° C. and a heating time of 5 hours. The thermal conductivity and the tensile shear bond strength of the permanent bonding body were used as standard values for comparison with other Examples and Comparative Examples.

Example 2-1

Example 2-1 is different from Example 1-1 in that the conditions of Example 3 in Table 1 (application of ethanol; at room temperature; pressing at 250 MPa/10 minutes) were used as conditions for preparation of a temporary bonding body. There was no significant difference in thermal con- Comparative Example 1-2

Comparative Example 1-2 is different from Example 1-1 in that temporary bonding was performed by performing press bonding with a vacuum heating press machine under the conditions of a pressure of 5 MPa, a heating temperature of 240° C. and a heating time of 5 hours, and permanent bonding was performed under the conditions (application of ethanol; at room temperature; pressing at 2 MPa/10 minutes). The metal plate and the ceramic resin composite sheet were not bonded to each other after permanent bonding. This demonstrates that reversal of the order of temporary bonding and permanent bonding is not effective.

TABLE 3

| | Temporary bonding conditions | | Permanent bonding conditions | | Relative thermal conductivity of permanent bonding body against that in Example 1-1 (%) | Relative tensile shear bond strength of permanent bonding body against that in Example 1-1 (%) |
|---|---|---|---|---|---|---|
| | Solvent | Bonding conditions | Solvent | Bonding conditions | | |
| Example 1-1 | Ethanol | Room temperature, 2 MPa, 10 min | Not used | 240° C., 5 MPa, 5 h | — | — |
| Example 2-1 | Ethanol | Room temperature, 250 MPa, 10 min | Not used | 240° C., 5 MPa, 5 h | 105 | 98 |
| Example 3-1 | Methanol | Room temperature, 2 MPa, 10 min | Not used | 240° C., 5 MPa, 5 h | 99 | 100 |
| Comparative Example 1-1 | Not used | 240° C., 5 MPa, 5 h | Not used | 240° C., 5 MPa, 5 h | 15 | 10 |
| Comparative Example 1-2 | Not used | 240° C., 5 MPa, 5 h | Ethanol | Room temperature, 2 MPa, 10 min | Not bonded | Not bonded | ductivity and tensile shear bond strength after permanent bonding between Example 2-1 and Example 1-1.

Example 3-1

Example 3-1 is different from Example 1-1 in that the conditions of Example 4 in Table 1 (application of ethanol; at room temperature; pressing at 2 MPa/10 minutes) were used as conditions for preparation of a temporary bonding body. There was no significant difference in thermal conductivity and tensile shear bond strength after permanent bonding between Example 3-1 and Example 1-1.

Comparative Example 1-1

Comparative Example 1-1 is different from Example 1-1 in that temporary bonding was performed by performing press bonding with a vacuum heating press machine under the conditions of a pressure of 5 MPa, a heating temperature of 240° C. and a heating time of 5 hours. The thermal conductivity and the tensile shear bond strength after permanent bonding are significantly inferior to those in Example 1-1. This demonstrates that once bonding is performed by heating and pressurization, bonding cannot be performed again without deteriorating physical properties.

The invention claimed is:

1. A ceramic-metal temporary bonding body, comprising:
   a ceramic resin composite in which a non-oxide ceramic sintered body is impregnated with a thermosetting resin composition having cyanate groups in such a manner that a degree of cure calculated by differential scanning calorimetry is 5.0% or more and 70% or less; and
   a metal adherend temporarily bonded to only one surface of the ceramic resin composite, wherein a shear bond strength between the ceramic resin composite and the metal adherend is 0.1 MPa or more and 1.0 MPa or less.

2. An object to be transported, in which the ceramic-metal temporary bonding body described in claim 1 is wrapped with a packaging material.

3. A method for transporting a ceramic-metal temporary bonding body, the method comprising the steps of:
   placing in a transportation box the object described in claim 2; and
   transporting the transportation box.

4. The method according to claim 3, wherein the object is placed in the transportation box together with a cushioning material to substantially prevent the ceramic-metal temporary bonding body from moving in the transportation box.

5. A method for producing a ceramic-metal temporary bonding body, the method comprising the steps of:
   preparing a ceramic resin composite by impregnating a non-oxide ceramic sintered body with a thermosetting resin composition having cyanate groups in such a manner that a degree of cure calculated by differential scanning calorimetry is 5.0% or more and 70% or less;

applying a liquid compound with active hydrogen to at least one surface of the ceramic resin composite or a metal adherend having a ten-point average roughness of 20 μm or less; and bringing only one surface of the ceramic resin composite and the metal plate adherend in close contact with each other, and then applying a compressive load of 250 MPa or less at a temperature of 0° ° C. to 40° ° C. to temporarily bond the only one surface of the ceramic resin composite and the metal plate-adherend to each other in such a manner that a shear bond strength between the ceramic resin composite and the metal plate-adherend is 0.1 MPa or more and 1.0 MPa or less.

* * * * *